(12) United States Patent
Kim et al.

(10) Patent No.: US 8,984,747 B2
(45) Date of Patent: Mar. 24, 2015

(54) METHOD FOR MANUFACTURING FABRIC TYPE CIRCUIT BOARD

(75) Inventors: Bae sun Kim, Daejeon (KR); Yong Ki Son, Daejeon (KR); Ji Eun Kim, Daejeon (KR); Sung yong Shin, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 122 days.

(21) Appl. No.: 13/440,580

(22) Filed: Apr. 5, 2012

(65) Prior Publication Data

US 2012/0255166 A1    Oct. 11, 2012

(30) Foreign Application Priority Data

Apr. 5, 2011  (KR) .................. 10-2011-0031431
Apr. 3, 2012  (KR) .................. 10-2012-0034336

(51) Int. Cl.
  *H05K 3/02*     (2006.01)
  *H05K 1/00*     (2006.01)
  *H05K 1/03*     (2006.01)
  *H05K 3/20*     (2006.01)

(52) U.S. Cl.
  CPC ............. *H05K 1/038* (2013.01); *H05K 3/20* (2013.01); *H05K 3/205* (2013.01); *H05K 2203/0156* (2013.01); *H05K 2203/068* (2013.01)
  USPC ........................................... 29/846; 174/254

(58) Field of Classification Search
  CPC .......... H05K 1/038; H05K 3/205; H05K 3/20
  USPC ........................................... 29/846; 174/254
  See application file for complete search history.

(56) References Cited

U.S. PATENT DOCUMENTS

| | | | | |
|---|---|---|---|---|
| 4,830,014 | A * | 5/1989 | Goodman et al. | 600/310 |
| 5,224,478 | A * | 7/1993 | Sakai et al. | 600/335 |
| 5,776,059 | A * | 7/1998 | Kaestle et al. | 600/340 |
| 5,792,052 | A * | 8/1998 | Isaacson et al. | 600/323 |
| 6,236,037 | B1 * | 5/2001 | Asada et al. | 250/221 |
| 6,388,247 | B2 * | 5/2002 | Asada et al. | 250/221 |
| 8,190,224 | B2 * | 5/2012 | Hoarau | 600/310 |
| 8,329,493 | B2 * | 12/2012 | Mascaro et al. | 438/51 |
| 2005/0286901 | A1 * | 12/2005 | Sasser et al. | 398/135 |
| 2008/0091121 | A1 * | 4/2008 | Sun et al. | 600/587 |

(Continued)

FOREIGN PATENT DOCUMENTS

| | | |
|---|---|---|
| KR | 10-2009-0093108 | 9/2009 |
| KR | 10-2009-0125729 | 12/2009 |
| KR | 10-2010-0084334 | 7/2010 |

OTHER PUBLICATIONS

Andreas Ostmann et al., "Stretchable Circuit Board Technology in Textile Applications", *International Microsystems, Packaging Assembly and Circuits Technology Conference*, 2009, pp. 216-219.

*Primary Examiner* — David Angwin
(74) *Attorney, Agent, or Firm* — Staas & Halsey LLP

(57) ABSTRACT

Methods for manufacturing a fabric-type circuit board, including: forming a metal plating layer on a base substrate, forming a circuit pattern by etching the metal plating layer, bonding a carrier film on the circuit pattern, and bonding an adhesive film directly below the circuit pattern after removing the base substrate; or bonding an adhesive film to a metal thin film, forming a circuit pattern by etching the metal thin film, and bonding a carrier film on the circuit pattern. In either case, the circuit pattern is transferred to a fabric by bonding the adhesive film to the fabric.

19 Claims, 4 Drawing Sheets

(56) References Cited

U.S. PATENT DOCUMENTS

2009/0168374 A1* 7/2009 Clayton et al. ............ 361/749
2010/0238636 A1* 9/2010 Mascaro et al. ........... 361/750
2012/0255166 A1* 10/2012 Kim et al. .................. 29/846
2012/0314382 A1* 12/2012 Wesselmann et al. ..... 361/749
2013/0087369 A1* 4/2013 Kim et al. .................. 174/254

* cited by examiner

METHOD FOR MANUFACTURING FABRIC TYPE CIRCUIT BOARD

CROSS-REFERENCES TO RELATED APPLICATIONS

The present application claims priority under 35 U.S.C. 119(a) to Korean Patent Application No. 10-2011-0031431 filed on Apr. 5, 2011 in the Korean Intellectual Property Office and Korean Patent Application No. 10-2012-0034336 filed on Apr. 3, 2012 in the Korean Intellectual Property Office, which are incorporated herein by reference in its entirety as set forth in full.

BACKGROUND

Exemplary embodiments of the present invention relate to a method for manufacturing a fabric type circuit board, and more particularly, to a method for manufacturing a fabric type circuit board forming a circuit pattern so as to operate electronic parts on a fabric material.

Recently, as an interest in a wearable computer has been rapidly increased, flexible input devices, communication devices, or the like, that are installed on a garment have been developed.

In particular, an attempt to use a fabric as a circuit board has been continuously conducted. When the fabric is used as the circuit board, the substrate is made of the same material as a garment, thereby making it possible to minimize foreign materials.

An example of a technology for forming a conductive circuit pattern on a fabric may include a transfer method, a deposition method, a printing method, an embroidery method, or the like.

The deposition method has been used to form a flexible PCB (FPCB) or a flexible copper clad laminate (FCCL) on a film or to manufacture a conductive thread, an EMI shielding fabric, a conductive tape, or the like, by thinly coating a thin film on a thread or a fabric. A simple circuit board may be manufactured by dicing the conductive tape in a circuit pattern shape and sticking the diced conductive tape to a fabric.

The transfer method prints a desired shape with transfer ink and transfers the printed shape to a fabric by thermo compressing the printed shape to the fabric. As an example of the transfer method may include various methods such as a thermal transfer method, a sublimation transfer method, an adhesive transfer method, or the like. The transfer method used for the fabric has been mainly used to decorate a fabric with pictures, logos, characters, or the like.

The printing method is performed by various kinds of printing processes such as a screen printing inkjet printer, a gravure printing inkjet printer, a flexo printing inkjet printer, or the like. In this case, the printing method prints and thermoplasticizes the pattern by commonly using the conductive ink to conduct electricity through the printed pattern.

The embroidery method conducts electricity by backstitching patterns or lines using a conductive thread.

As a relevant prior art, there is Korean Laid-Open Patent No. 10-2010-0084334 (Jul. 26, 2010) entitled "Printed Circuit Board of Fabric Type Using Metal Tape and Metal Thin Paper and Manufacturing Method Thereof".

As such, the fabric type circuit board may be strong against stress such as various types of external torsions and is more flexible. On the other hand, due to the above-mentioned advantages, it is difficult to form the circuit pattern on the fabric. In particular, the above-mentioned methods have several problems when a line width of about 0.3 mm is implemented.

In the case of the embroidery method, it is difficult to manage a knot of the thread and implement a fine circuit pattern. In the case of the deposition and plating methods, it is difficult to deposit the fine circuit pattern on the fabric like a general film substrate. The plating method cannot also be applied to the fabric.

The printing method can print the fine circuit pattern when the fabric is selected well, but can easily disconnect the pattern due to the external stress like bending.

The transfer method may be used to thinly stack electronic parts. As a relevant study using an electrode pattern used for a fabric, there is a STELLA project that has been researched in Europe.

The STELLA project may use flexible thermal polyurethane (TPU) as a base substrate for forming a circuit pattern to form an electrode pattern by an existing flexible PCB manufacturing method, extend a pattern formed by connecting the electrode pattern in a U-letter shape up and down, and may use the pattern bonded to the base substrate like a fabric by applying heat to the TPU that is the base substrate.

However, the transfer method may hinder ventilation of a fabric by applying the TPU to the whole bonding surface, hardly form the fine circuit pattern due to the flexible base substrate, and degrade adhesion when the transferred fabric does not fit with TPU resin.

SUMMARY

An embodiment of the present invention is directed to a method for manufacturing a fabric type circuit board capable of securing strong durability against flexibility of a fabric and sufficient electric conductivity and maintaining ventilation when forming a circuit pattern on a fabric.

In addition, another embodiment of the present invention is directed to a method for manufacturing a fabric type circuit board capable of using various mounting methods such as soldering, wire bonding, or the like, when electronic parts are mounted.

An embodiment of the present invention relates to a method for manufacturing a fabric type circuit board including: forming a metal plating layer on a base substrate; forming a circuit pattern by etching the metal plating layer; bonding a carrier film on the circuit pattern; bonding an adhesive film after removing the base substrate; and transferring the circuit pattern by bonding the adhesive film to the fabric.

The base substrate may be a polymer film including any one of polyester (PET), polycarbonate (PC) and polypropylene sulfide (PPS).

The base substrate may be a metal foil including any one of stainless steel (SUS), copper foil, nickel foil and aluminum foil.

The forming of the metal plating layer may include forming a metal seed layer on the base substrate by a vacuum sputtering method.

The metal plating layer may be formed at a thickness of 1 to 35 μm by performing wet plating on copper.

The adhesive film may be bonded at a speed of 1 to 1.5 m/min, a pressure of 1.8 to 2.2 kgf/cm$^2$, and a temperature of 90° C. to 110° C.

The adhesive film may be any one of acrylic-based, urethane-based, polyester-based, and polyimide varnish-based adhesives.

The forming of the circuit pattern may include bonding an exposure film to the metal plating layer at a speed of 1 to 1.5 m/min, a pressure of 5 to 7 kgf/cm$^2$ and a temperature of 100° C. to 120° C., exposing the exposure film and spraying an etchant to form the circuit pattern.

At the transferring of the circuit pattern, a thermal compression apparatus may primarily perform thermal compression for 15 to 20 minutes at a pressure of 13 to 16 kgf/cm$^2$ and a temperature of 90° C. to 110° C. and secondarily perform thermal compression for 40 to 50 minutes at a pressure of 18 to 22 kgf/cm$^2$ and a temperature of 150° C. to 170° C.

The method for manufacturing a fabric type circuit boar may further include forming an anti-oxidation layer on the circuit pattern transferred to the fabric.

The anti-oxidation layer may be formed at 1 μm or less by electroless-plating any one of tin, silver, and gold.

Another embodiment of the present invention relates to a method for manufacturing a fabric type circuit board may including: bonding an adhesive film to a metal thin film; forming a circuit pattern by etching the metal thin film; bonding a carrier film on the circuit pattern; and transferring the circuit pattern by bonding the adhesive film to a fabric.

The metal thin film may be a copper foil of a thickness of 18 μm or 35 μm.

The adhesive film may be bonded at a speed of 1 to 1.5 m/min, a pressure of 1.8 to 2.2 kgf/cm$^2$, and a temperature of 90° C. to 110° C.

The adhesive film may be any one of acrylic-based, urethane-based, polyester-based, and polyimide varnish-based adhesives.

The forming of the circuit pattern may include bonding an exposure film to the metal thin film at a speed of 1 to 1.5 m/min, a pressure of 5 to 7 kgf/cm$^2$ and a temperature of 100° C. to 120° C., exposing the exposure film and spraying an etchant to form the circuit pattern.

At the transferring of the circuit pattern, a thermal compression apparatus may primarily perform thermal compression for 15 to 20 minutes at a pressure of 13 to 16 kgf/cm$^2$ and a temperature of 90° C. to 110° C. and secondarily perform thermal compression for 40 to 50 minutes at a pressure of 18 to 22 kgf/cm$^2$ and a temperature of 150° C. to 170° C.

The method for manufacturing a fabric type circuit board may further include forming an anti-oxidation layer on the circuit pattern transferred to the fabric.

The anti-oxidation layer may be formed at 1 μm or less by electroless-plating any one of tin, silver, and gold.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
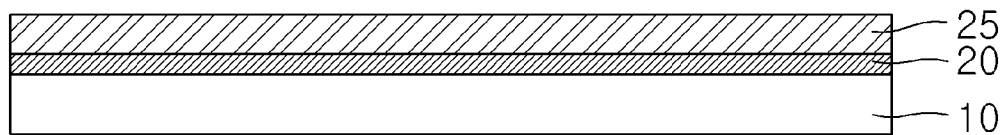
FIGS. 1 to 7 are cross-sectional views sequentially illustrating a method for manufacturing a fabric type circuit board in accordance with an embodiment of the present invention.

Hereinafter, an apparatus and a method for inputting information based on events in accordance with an embodiment of the present invention will be described with reference to the accompanying drawings. In describing the embodiment, a thickness of lines illustrated in the drawings, a size of components, etc., may be exaggeratedly illustrated for clearness and convenience of explanation. In addition, terms described to be below are terms defined in consideration of functions in the present invention, which may be changed according to the intention or practice of a user or an operator. Therefore, these terms will be defined based on contents throughout the specification.

FIGS. 1 to 7 are cross-sectional views sequentially illustrating a method for manufacturing a fabric type circuit board in accordance with an embodiment of the present invention.

As illustrated in FIG. 1, a metal seed layer 20 and a metal plating layer 25 are first formed on a base substrate 10.

The base substrate 10 uses a polymer film or a metal foil for forming a circuit pattern to be transferred to a fabric 60. As a polymer film, any one of polyester (PET), polycarbonate (PC), polypropylene sulfide (PPS) may be used.

In this case, when the polymer film is used as the base substrate 10, a circuit pattern and a metal releasing layer (not illustrated) for releasing the base substrate 10 (not illustrated) may be also formed.

As the metal foil, any one of stainless steel (SUS), copper foil, nickel foil, and aluminum foil may be used. In the case of the metal foil, an oxide layer (not illustrated) is formed on a surface and thus, releasing is easily made even though a separate releasing layer is not formed.

A metal seed layer 20 is provided with a copper seed at a thickness of 1 μm or less by a vacuum sputtering method. In this case, the metal seed layer 20 is formed so as to easily plate the metal plating layer 25 and may be preferably controlled to have weak bonding strength so as to be easily released from the base substrate 10.

Next, the metal plating layer 25 is formed by plating copper at a thickness of 1 to 35 μm by a wet plating method.

When the circuit pattern is formed of copper, silver, other metal power pastes by a screen printing method, polymer filler is disposed on a surface of the circuit pattern and thus, electronic parts (not illustrated) cannot be mounted on the surface thereof by soldering or wire bonding. However, the embodiment of the present invention forms the circuit pattern as the metal plating layer 25 and may use various mounting methods such as a surface mounting technology (SMT), ultrasonic bonding, wire bonding, or the like.

Figure 2:
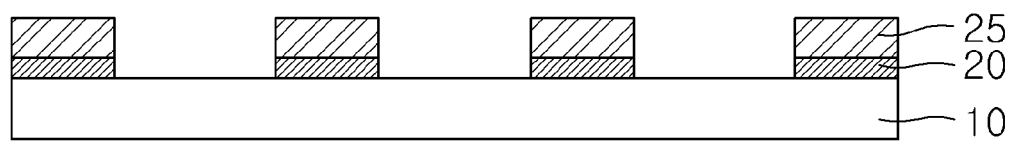

As illustrated in FIG. 2, an exposure film (not illustrated) is boned and exposed to the metal plating layer 25 at a speed of 1 to 1.5 m/min, a pressure of 5 to 7 kgf/cm$^2$, and a temperature of 100° C. to 120° C.

Next, the circuit pattern to be transferred to the fabric 60 is formed by etching the metal plating layer 25 and the metal seed layer 20 using the base substrate 10 as a stopping layer by spraying an etchant.

In this case, the spray pressure of the etchant is sprayed at a lower pressure than that of a general PCB process.

Figure 3:
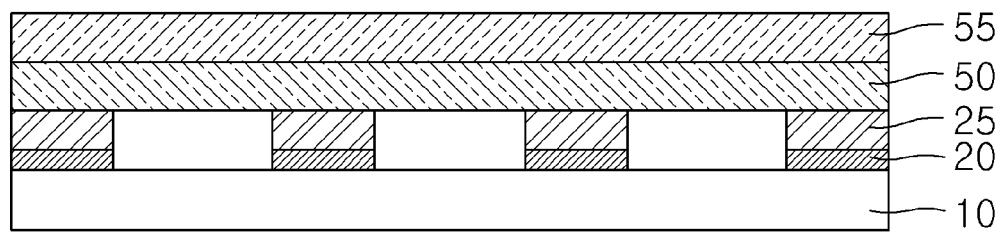

As illustrated in FIG. 3, for transferring the circuit pattern to the fabric 60, a carrier film 50 is bonded so as to maintain the circuit pattern.

The carrier film 50 may preferably have low-temperature adhesion higher than that of an adhesive film 30 as a material that may be bonded at weak pressure at normal temperature without the help of water, solvent, heat, or the like, and may preferably have the bonding strength of about 20 g/cm so as to easily release the base substrate 10.

A front of the carrier film 50 may be further provided with a carrier protective film 55 of a thickness of 100 to 200 μm that fixes the carrier film 50.

Figure 4:
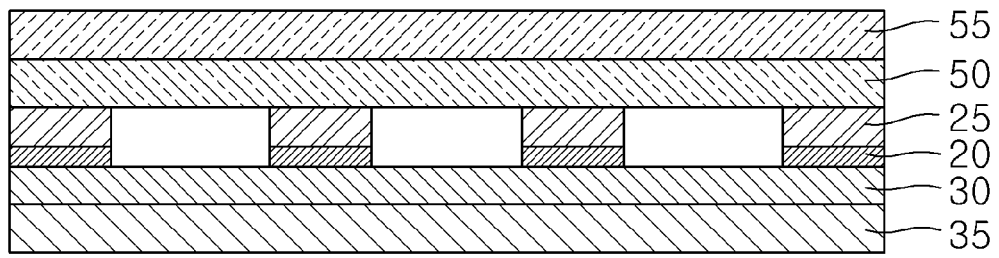

As illustrated in FIG. 4, after the base substrate 10 is removed, the adhesive film 30 is bonded. In this case, the adhesive film 30 is transferred to the fabric 60 by being bonded to only the circuit pattern to improve ventilation.

The adhesive film 30 may be preferably made of the same series according to a material of the fabric 60 as any one of acrylic-based, urethane-based, polyester-based, and polyimide varnish-based adhesives and a weaving method. For example, in the case of the polyester fabric, the polyester adhesive may be preferably used.

The adhesive film 30 is bonded at a speed of 1 to 1.5 m/min, a pressure of 1.8 to 2.2 kgf/cm$^2$, and a temperature of 90° C. to 110° C. This may vary according to use equipment and an adhesive applied to the adhesive film 30.

The adhesive film 30 having a thickness of 35 μm has weaker adhesion than that of the carrier film 50 in the case of the low temperature and has higher adhesion than that of the carrier film 50 in the case of the high temperature.

The front of the adhesive film 30 may be further provided with a release protective film 35 of a thickness of 100 to 200 μm that fixes the adhesive film 30.

Figure 5:
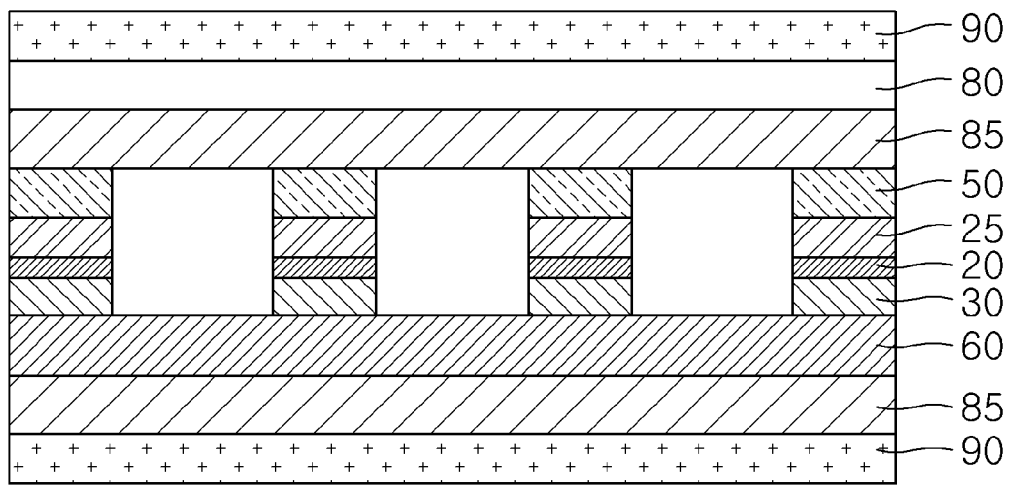

As illustrated in FIG. 5, after a carrier protective film 55 and a release protective film 35 are removed, the circuit pattern is transferred to the fabric 60 by a thermo compression process.

Before the circuit pattern is transferred to the fabric 60, ventilation may be maintained by dicing an unnecessary portion other than the circuit pattern and transferring only the circuit pattern, and bonding the circuit pattern to the fabric 60.

In order to prevent the fabric 60 from being damaged due to the thermo compression or the fabric 60 from being bonded to the hot plate 90, the thermo compression process bonds a releasing paper 85 to a hot plate 90 of a thermo compression apparatus (not illustrated), presses the releasing paper 85 and a buffering member 80 on the carrier film 50 by the hot plate 90 in the state in which the circuit pattern is disposed on the fabric 60 to horizontally transfer compression force.

In this case, the buffering member 80 may be added to any side of the hot plate 90 and the compression force pressed by the hot plate 90 may be uniformly transferred to the whole compression surface.

In accordance with the embodiment of the present invention, the thermo compression is primarily performed for 15 to 20 minutes at a pressure of 13 to 16 kgf/cm$^2$ and a temperature of 90° C. to 110° C. and is secondarily performed for 40 to 50 minutes at a pressure of 18 to 22 kgf/cm$^2$ and a temperature of 150° C. to 170° C. and then, the cooling is performed, such that the adhesion of the carrier film 50 is lowered and the adhesive film 30 has increased adhesion, thereby easily releasing the carrier film 50.

The fabric 60 may be preferably made of a material having excellent heat-resistant property, low thermal shrinkage percentage, and a dense weaving structure. In the embodiment of the present invention, a polyester-based fiber material is used.

Figure 6:
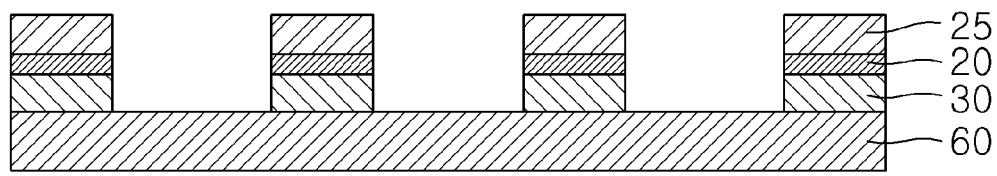

As illustrated in FIG. 6, the fabric type circuit board is completed by bonding the fabric 60 by the thermo compression process and then, removing the carrier film 50.

Figure 7:
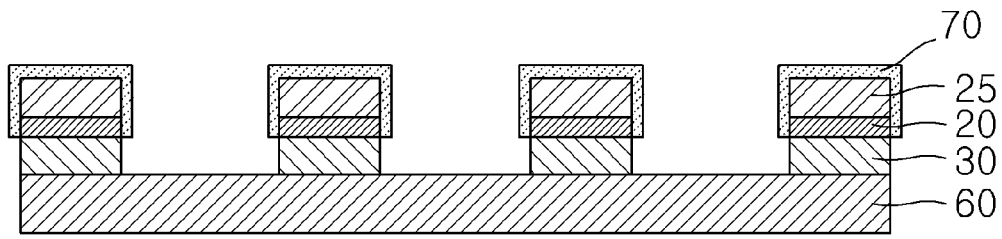

As illustrated in FIG. 7, an anti-oxidation layer 70 for preventing oxidation of the circuit patterns is formed.

When the circuit pattern of metal is exposed to air for a long period of time, the circuit pattern is oxidized to deteriorate the bonding performance when the electronic parts are mounted. In order to improve the above problem, the metal plating layer 25 is subjected to electroless tin plating at a thickness of 1 μm or less to prevent the circuit pattern from being oxidized and improve the bonding strength of the electronic parts, thereby improving reliability.

The anti-oxidization layer 70 may be formed by plating tin, silver, and gold.

FIGS. 8 to 13 are cross-sectional views sequentially illustrating a method for manufacturing a fabric type circuit board in accordance with another embodiment of the present invention.

Figure 8:
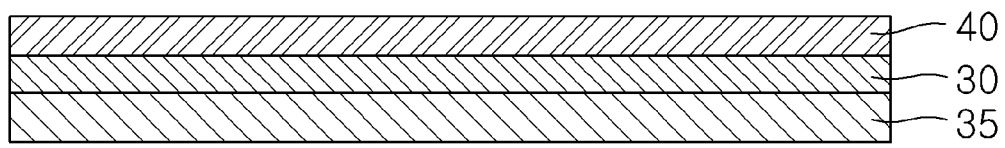
FIGS. 8 to 13 are cross-sectional views sequentially illustrating a method for manufacturing a fabric type circuit board in accordance with another embodiment of the present invention.

As illustrated in FIG. 8, a metal thin film 40 is bonded to the adhesive film 30.

The metal thin film 40 may be preferably made of a copper foil having a thickness of 18 μm or 35 μm.

The copper foil has the high bonding strength when surface roughness of a matte side is increased as the thickness is thick, but the flexibility of the copper is deteriorated and thus, the occurrence of cracks is increased due to the bending. Therefore, it is preferable to appropriately select the thickness of the copper foil.

The adhesive film 30 may be preferably made of the same series according to a material of the fabric 60 as any one of acrylics, urethanes, polyesters, and polyimide varnishes and a weaving method. For example, in the case of the polyester fabric, the polyester adhesive may be preferably used.

The adhesive film 30 is bonded to the metal thin film 40 at a speed of 1 to 1.5 m/min, a pressure of 1.8 to 2.2 kgf/cm$^2$, and a temperature of 90° C. to 110° C. This may vary according to use equipment and an adhesive applied to the adhesive film 30.

In this case, the bonding is made so that bubbles does not remain at the interface between the adhesive film 30 and the metal thin film 40 and the etchant is not permeated to the interface between the metal thin film 40 and the adhesive film 30 during the etching process.

The adhesive film 30 having a thickness of 35 μm has weaker adhesion than that of the carrier film 50 in the case of the low temperature and has higher adhesion than that of the carrier film 50 in the case of the high temperature.

In the embodiment of the present invention, a film type sheet is used but when a liquid adhesive is used, the bonding may be made by using the gravure printing method or the screen printing method.

The front of the adhesive film 30 may be further provided with a release protective film 35 of a thickness of 100 to 200 μm that fixes the adhesive film 30.

Figure 9:
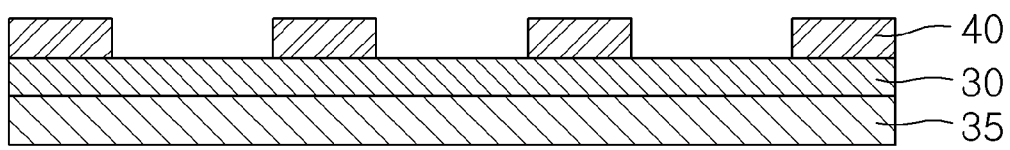

As illustrated in FIG. 9, the exposure film (not illustrated) is bonded and exposed to the metal thin film 40 at a speed of 1 to 1.5 m/min, a pressure of 5 to 7 kgf/cm$^2$, and a temperature of 100° C. to 120° C.

Next, the circuit pattern to be transferred to the fabric 60 is formed by etching the metal thin film 40 using the base substrate 10 as a stopping layer by spraying an etchant.

In this case, the spray pressure of the etchant is sprayed at lower pressure than that of the PCB process to prevent the etchant from being permeated into the interface between the adhesive film 30 and the metal thin film 40.

Figure 10:
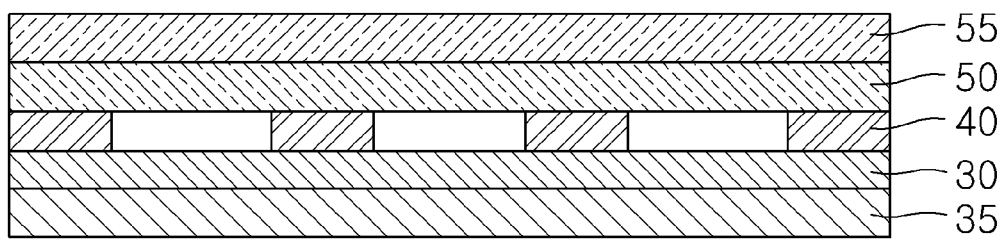

As illustrated in FIG. 10, for transferring the circuit pattern to the fabric 60, a carrier film 50 is bonded so as to maintain the circuit pattern.

The carrier film 50 may preferably have low-temperature adhesion higher than that of an adhesive film 30 as a material that may be bonded at weak pressure at normal temperature without the help of water, solvent, heat, or the like.

A front of the carrier film 50 may be further provided with a carrier protective film 55 of a thickness of 100 to 200 μm that fixes the carrier film 50.

Figure 11:
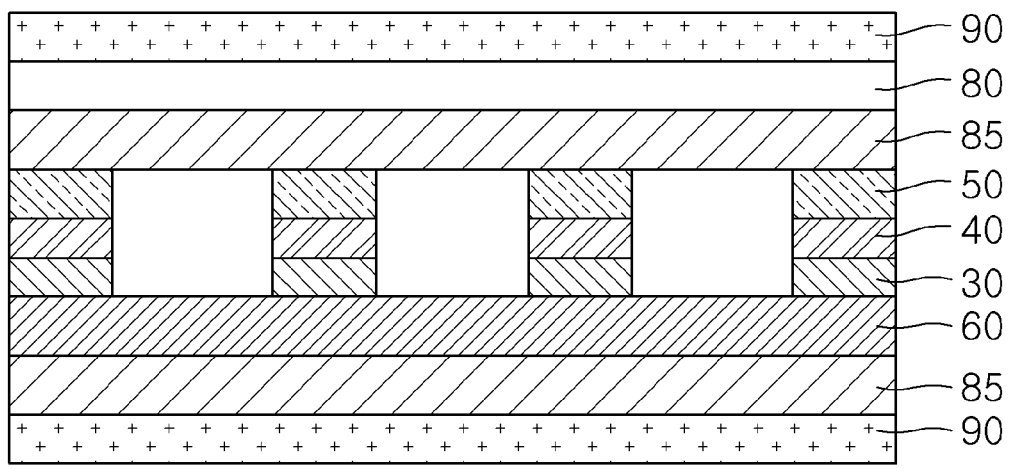

As illustrated in FIG. 11, after a carrier protective film 55 and a release protective film 35 are removed, the circuit patterns are transferred to the fabric 60 by a thermo compression process.

Before the circuit pattern is transferred to the fabric 60, ventilation may be maintained by dicing an unnecessary portion other than the circuit pattern and transferring only the circuit pattern, and bonding the circuit pattern to the fabric 60.

In order to prevent the fabric 60 from being damaged due to the thermo compression or the fabric 60 from being bonded to the hot plate 90, the thermo compression process bonds a releasing paper 85 to a hot plate 90 of a thermo compression apparatus (not illustrated), presses the releasing paper 85 and a buffering member 80 on the carrier film 50 by the hot plate 90 in the state in which the circuit pattern is disposed on the fabric 60 to horizontally transfer compression force.

In this case, the buffering member 80 may be added to any side of the hot plate 90 and the compression force pressed by the hot plate 90 may be uniformly transferred to the whole compression surface.

In accordance with the embodiment of the present invention, the thermo compression is primarily performed for 15 to 20 minutes at a pressure of 13 to 16 kgf/cm$^2$ and a temperature of 90° C. to 110° C. and is secondarily performed for 40 to 50 minutes at a pressure of 18 to 22 kgf/cm$^2$ and a temperature of 150° C. to 170° C. and then, the cooling is performed, such that the adhesion of the carrier film 50 is lowered and the adhesive film 30 has increased adhesion, thereby easily releasing the carrier film 50.

The fabric 60 may be preferably made of a material having excellent heat-resistant property, low thermal shrinkage percentage, and a dense weaving structure. In the embodiment of the present invention, a polyester-based fiber material is used.

Figure 12:
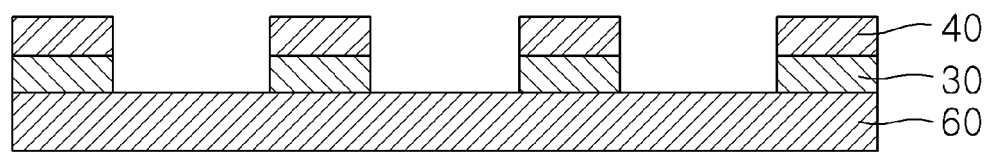

As illustrated in FIG. 12, the fabric type circuit board is completed by bonding the fabric 60 by the thermo compression process and then, removing the carrier film 50.

Figure 13:
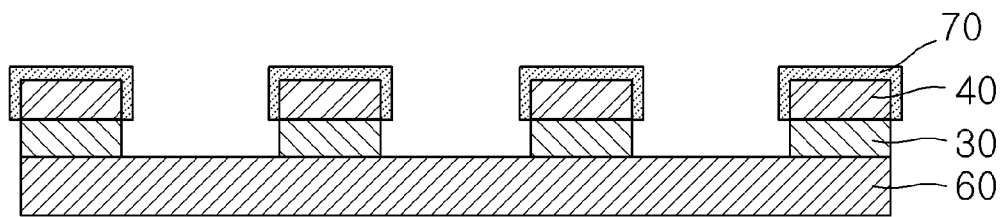

As illustrated in FIG. 13, an anti-oxidation layer 70 for preventing oxidation of the circuit patterns is formed. When the circuit pattern of metal is exposed to air for a long period of time, the circuit pattern is oxidized to deteriorate the bonding performance when the electronic parts are mounted. In order to improve the above problem, the metal thin film 40 is subjected to electroless tin plating at a thickness of 1 μm or less to prevent the circuit pattern from being oxidized and improve the bonding strength of the electronic parts, thereby improving reliability.

The anti-oxidation layer 70 may be formed by plating tin, silver, and gold.

In accordance with the method for manufacturing a direct type circuit board of the embodiment of the present invention, the fine pattern can be formed by performing the etching process on the metal layer when the circuit pattern to be transferred to the fabric 60 is formed, the circuit pattern is transferred to the fabric 60 through the thermosetting adhesive film 30 to secure the strong durability against the flexibility of the fabric and the sufficient electric conductivity and maintain the ventilation, and various mounting methods such as soldering, wire bonding, or the like, can be used when the electronic parts are mounted.

The embodiments of the present invention can form the fine pattern by performing the etching process on the metal layer when the circuit pattern is formed, transfer the circuit pattern to the fabric by the thermosetting adhesive film to secure the strong durability against the flexibility of the fabric and the sufficient electric conductivity and maintain the ventilation, and apply various mounting methods such as soldering, wire bonding, or the like, when the electronic parts are mounted.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for manufacturing a fabric type circuit board, comprising:
    forming a metal plating layer on a base substrate;
    forming a circuit pattern by etching the metal plating layer;
    bonding a carrier film on the circuit pattern;
    bonding an adhesive film directly below the circuit pattern after removing the base substrate; and
    transferring the circuit pattern by bonding the adhesive film to a fabric, thereby manufacturing the fabric type circuit board.

2. The method of claim 1, wherein the base substrate is a polymer film including any one of polyester (PET), polycarbonate (PC) and polypropylene sulfide (PPS).

3. The method of claim 1, wherein the base substrate is a metal foil including any one of stainless steel (SUS), copper foil, nickel foil and aluminum foil.

4. The method of claim 1, wherein the forming of the metal plating layer includes forming a metal seed layer on the base substrate by a vacuum sputtering method.

5. The method of claim 1, wherein the metal plating layer is formed at a thickness of 1 to 35 μm by performing wet plating on copper.

6. The method of claim 1, wherein the adhesive film is bonded at a speed of 1 to 1.5 m/min, a pressure of 1.8 to 2.2 kgf/cm$^2$, and a temperature of 90° C. to 110° C.

7. The method of claim 1, wherein the adhesive film is any one of acrylic-based, urethane-based, polyester-based, and polyimide varnish-based adhesives.

8. The method of claim 1, wherein the forming of the circuit pattern includes bonding an exposure film to the metal plating layer at a speed of 1 to 1.5 m/min, a pressure of 5 to 7 kgf/cm$^2$ and a temperature of 100° C. to 120° C., exposing the exposure film and spraying an etchant to form the circuit pattern.

9. The method of claim 1, wherein at the transferring of the circuit pattern, a thermal compression apparatus primarily performs thermal compression for 15 to 20 minutes at a pressure of 13 to 16 kgf/cm$^2$ and a temperature of 90° C. to 110° C. and secondarily performs thermal compression for 40 to 50 minutes at a pressure of 18 to 22 kgf/cm$^2$ and a temperature of 150° C. to 170° C.

10. The method of claim 1, further comprising forming an anti-oxidation layer on the circuit pattern transferred to the fabric.

11. The method of claim 10, wherein the anti-oxidation layer is formed at 1 μm or less by electroless-plating any one of tin, silver and gold.

12. A method for manufacturing a fabric type circuit board, comprising:
    bonding an adhesive film to a metal thin film;
    forming a circuit pattern by etching the metal thin film;
    bonding a carrier film on the circuit pattern; and
    transferring the circuit pattern by bonding the adhesive film to a fabric, thereby manufacturing the fabric type circuit board.

13. The method of claim 12, wherein the metal thin film is a copper foil of a thickness of 18 μm or 35 μm.

14. The method of claim 12, wherein the adhesive film is bonded at a speed of 1 to 1.5 m/min, a pressure of 1.8 to 2.2 kgf/cm$^2$, and a temperature of 90° C. to 110° C.

15. The method of claim 12, wherein the adhesive film is any one of acrylic-based, urethane-based, polyester-based, and polyimide varnish-based adhesives.

16. The method of claim 12, wherein the forming of the circuit pattern includes bonding an exposure film to the metal thin film at a speed of 1 to 1.5 m/min, a pressure of 5 to 7 kgf/cm$^2$ and a temperature of 100° C. to 120° C., exposing the exposure film and spraying an etchant to form the circuit pattern.

17. The method of claim 12, wherein at the transferring of the circuit pattern, a thermal compression apparatus primarily performs thermal compression for 15 to 20 minutes at a pressure of 13 to 16 kgf/cm$^2$ and a temperature of 90° C. to 110° C. and secondarily performs thermal compression for 40 to 50 minutes at a pressure of 18 to 22 kgf/cm$^2$ and a temperature of 150° C. to 170° C.

18. The method of claim 12, further comprising forming an anti-oxidation layer on the circuit pattern transferred to the fabric.

19. The method of claim 18, wherein the anti-oxidation layer is formed at 1 μm or less by electroless-plating any one of tin, silver and gold.

* * * * *